(12) United States Patent
Wang et al.

(10) Patent No.: US 11,444,128 B2
(45) Date of Patent: Sep. 13, 2022

(54) WHITE ORGANIC LIGHT-EMITTING DIODE DISPLAY SUBSTRATE INCLUDING SWITCHING TFT AND LIGHT-SHIELDING LAYER ARRANGED TO PREVENT NEGATIVE DRIFT

(71) Applicant: BOE TECHNOLOGY GROUP CO., LTD., Beijing (CN)

(72) Inventors: Dongfang Wang, Beijing (CN); Tongshang Su, Beijing (CN); Ming Wang, Beijing (CN); Ce Zhao, Beijing (CN); Bin Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 667 days.

(21) Appl. No.: 16/338,935

(22) PCT Filed: Sep. 20, 2018

(86) PCT No.: PCT/CN2018/106588
§ 371 (c)(1),
(2) Date: Apr. 2, 2019

(87) PCT Pub. No.: WO2019/114358
PCT Pub. Date: Jun. 20, 2019

(65) Prior Publication Data
US 2021/0343799 A1 Nov. 4, 2021

(30) Foreign Application Priority Data
Dec. 14, 2017 (CN) .......................... 201711338884.1

(51) Int. Cl.
*H01L 27/32* (2006.01)

(52) U.S. Cl.
CPC ...... *H01L 27/3213* (2013.01); *H01L 27/3262* (2013.01); *H01L 27/3272* (2013.01); *H01L 2251/308* (2013.01)

(58) Field of Classification Search
CPC ............. H01L 27/3213; H01L 27/3262; H01L 27/3272
(Continued)

(56) References Cited

U.S. PATENT DOCUMENTS

| 5,994,721 A | 11/1999 | Zhong et al. |
| 9,202,855 B1 | 12/2015 | Jo et al. |

(Continued)

FOREIGN PATENT DOCUMENTS

| CN | 103000661 A | 3/2013 |
| CN | 104241326 A | 12/2014 |

(Continued)

OTHER PUBLICATIONS

European Patent Office Search Report published Aug. 25, 2021 (Year: 2021).*

(Continued)

*Primary Examiner* — Matthew E. Gordon
(74) *Attorney, Agent, or Firm* — Brooks Kushman P.C.

(57) ABSTRACT

An OLED display substrate, a manufacturing method and a display device are provided. The OLED display substrate includes a base substrate and a plurality of pixel units arranged on the base substrate, each pixel unit includes a plurality of subpixel units, and each subpixel unit includes a switching TFT and a bottom-emission OLED, the OLED display substrate further includes a light-shielding layer arranged between the OLED and the switching TFT, and an orthogonal projection of the light-shielding layer onto the (Continued)

base substrate completely covers an orthogonal projection of a semiconductor region of the switching TFT onto the base substrate.

20 Claims, 1 Drawing Sheet

(58) Field of Classification Search
USPC .......................................................... 257/40
See application file for complete search history.

(56) References Cited

U.S. PATENT DOCUMENTS

| | | |
|---|---|---|
| 2001/0025958 A1 | 10/2001 | Yamazaki et al. |
| 2004/0135148 A1 | 7/2004 | Lin |
| 2005/0168135 A1 | 8/2005 | Iga |
| 2009/0243482 A1 | 10/2009 | Tohyama et al. |
| 2014/0159016 A1* | 6/2014 | Song .................. H01L 27/322 257/40 |
| 2015/0349040 A1 | 12/2015 | Park et al. |
| 2016/0099293 A1 | 4/2016 | Jung et al. |
| 2016/0372532 A1 | 12/2016 | Song et al. |

FOREIGN PATENT DOCUMENTS

| | | |
|---|---|---|
| CN | 104659066 A | 5/2015 |
| CN | 107170762 A | 9/2017 |
| EP | 0708356 A2 | 4/1996 |
| EP | 2816603 A1 | 12/2014 |
| KR | 20070075920 A | 7/2007 |
| TW | 200412825 A | 7/2004 |

OTHER PUBLICATIONS

Extended European Search Report for Application No. 18859954.2, dated Aug. 25, 2021, 9 Pages.

International Search Report and Written Opinion for Application No. PCT/CN2018/106588, dated Dec. 12, 2018, 10 Pages.

* cited by examiner

WHITE ORGANIC LIGHT-EMITTING DIODE DISPLAY SUBSTRATE INCLUDING SWITCHING TFT AND LIGHT-SHIELDING LAYER ARRANGED TO PREVENT NEGATIVE DRIFT

CROSS-REFERENCE TO RELATED APPLICATION APPLICATIONS

This application is the U.S. national phase of PCT Application No. PCT/CN2018/106588 filed on Sep. 20, 2018, which claims priority to Chinese Patent Application No. 201711338884.1 filed on Dec. 14, 2017, which are incorporated herein by reference in their entireties.

TECHNICAL FIELD

The present disclosure relates to the field of display technology, in particular to an organic light-emitting diode (OLED) display substrate, a display device, and a manufacturing method thereof.

BACKGROUND

A conventional bottom-emission OLED display substrate mainly includes a base substrate and a plurality of pixel units arranged on the base substrate. Each pixel unit includes a plurality of subpixel units in various colors, and each subpixel unit includes a thin film transistor (TFT) driving layer and a bottom-emission OLED. The TFT driving layer includes a switching TFT and a driving TFT. In the conventional bottom-emission OLED display substrate, there is no barrier between the switching TFT and the bottom-emission OLED, so a light beam from the bottom-emission OLED is capable of arriving at the switching TFT. However, when the switching TFT is an oxide TFT, it is relatively sensitive to a light beam having a low band, e.g., blue light. When this kind of light beam arrives at the switching TFT, such a phenomenon as negative drill may occur. When the negative drift exceeds an off-state voltage (Vgl) of the switching TFT, the switching TFT may be turned on abnormally, resulting in current leakage for a corresponding capacitor and further a display abnormality.

SUMMARY

In one aspect, the present disclosure provides in some embodiments an OLED display substrate, including a base substrate and a plurality of pixel units arranged on the base substrate. Each pixel unit includes a plurality of subpixel units, and each subpixel unit includes a switching TFT and an OLED. The OLED display substrate further includes a light-shielding layer arranged between the OLED and the switching TFT, and an orthogonal projection of the light-shielding layer onto the base substrate completely covers an orthogonal projection of a semiconductor region of the switching TFT onto the base substrate.

In a possible embodiment of the present disclosure, the OLED display substrate is a white OLED display substrate, the OLED is a white OLED, and each subpixel unit further includes a color filter unit corresponding to a color of the subpixel unit.

In a possible embodiment of the present disclosure, a first color filter unit in a first color and a second color filter unit in a second color are arranged at a region where each pixel unit is located, the first color filter unit is configured to filter out a blue light beam, and the second color filter unit is configured to allow the blue light beam to pass therethrough.

In a possible embodiment of the present disclosure, the light-shielding layer is created from a same layer as the first color filter unit.

In a possible embodiment of the present disclosure, the first color is red or green, and the second color is blue or white.

In a possible embodiment of the present disclosure, in each pixel unit, the switching TFT of each subpixel unit is arranged at a same side of a region where the color filter unit is located and arranged adjacent to the first color filter unit, and the light-shielding layer is connected to the first color filter unit.

In a possible embodiment of the present disclosure, each pixel unit includes a red subpixel unit, a green subpixel unit, a blue subpixel unit and a white subpixel unit. The light shielding layer, a red color filter unit corresponding to the red subpixel unit, a switching TFT corresponding to the red subpixel unit, a green color filter unit corresponding to the green subpixel unit, a switching TFT corresponding to the green subpixel unit, a blue color filter unit corresponding to the blue subpixel unit, a switching TFT corresponding to the blue subpixel unit, a white color filter unit corresponding to the white subpixel unit and a switching TFT corresponding to the white subpixel unit are arranged at a region where each pixel unit is located. The red color filter unit, the green color filter unit, the blue color filter unit and the white color filter unit are arranged in two rows and two columns, the red color filter unit and the green color filter unit are arranged in a same row, and the blue color filter unit and the white color filter unit are arranged in a same row. The light-shielding layer includes a red light-shielding layer connected to the red color filter unit and a green light-shielding layer connected to the green color filter unit. Orthogonal projections of the red light-shielding layer and the green light-shielding layer onto the base substrate completely cover orthogonal projections of the semiconductor regions of all the switching TFTs in each pixel unit onto the base substrate.

In a possible embodiment of the present disclosure, the orthogonal projection of the semiconductor region of the switching TFT of the red subpixel unit onto the base substrate is located within the orthogonal projection of the red light-shielding layer onto the base substrate, the orthogonal projection of the semiconductor region of the switching TFT of the green subpixel unit onto the base substrate is located within the orthogonal projection of the green light-shielding layer onto the base substrate, the orthogonal projection of the semiconductor region of the switching TFT of one of the blue subpixel unit and the white subpixel unit onto the base substrate is located within the orthogonal projection of the red light-shielding layer onto the base substrate, and the orthogonal projection of the semiconductor region of the switching TFT of the other one of the blue subpixel unit and the white subpixel unit onto the base substrate is located within the orthogonal projection of the green light-shielding layer onto the base substrate.

In a possible embodiment of the present disclosure, in each pixel unit, the switching TFT of each subpixel unit is located at a same side of a region where the color filter unit is located and arranged adjacent to the corresponding color filter unit. The light-shielding layer includes a first light-shielding layer and a second light-shielding layer. The first light-shielding layer is connected to the first color filter unit, and an orthogonal projection of the first light-shielding layer onto the base substrate completely covers the orthogonal projection of the semiconductor region of the switching TFT of the subpixel unit in the first color onto the base substrate. The second light-shielding layer is spaced apart from the second color filter unit, and an orthogonal projection of the second light-shielding layer onto the base substrate completely covers the orthogonal projection of the semiconductor region of the switching TFT of the subpixel unit in the second color onto the base substrate.

In a possible embodiment of the present disclosure, each pixel unit includes a red subpixel unit, a green subpixel unit, a blue subpixel unit and a white subpixel unit. The light shielding layer, a red color filter unit corresponding to the red subpixel unit, a switching TFT corresponding to the red subpixel unit, a green color filter unit corresponding to the green subpixel unit, a switching TFT corresponding to the green subpixel unit, a blue color filter unit corresponding to the blue subpixel unit, a switching TFT corresponding to the blue subpixel unit, a white color filter unit corresponding to the white subpixel unit and a switching TFT corresponding to the white subpixel unit are arranged at a region where each pixel unit is located. The red color filter unit, the green color filter unit, the blue color filter unit and the white color filter unit are arranged in one row and four columns. The first light-shielding layer includes a red light-shielding layer and a first green light-shielding layer. The red light-shielding layer is connected to the red color filter unit, and an orthogonal projection of the red light-shielding layer onto the base substrate completely covers an orthogonal projection of a semiconductor region of the switching TFT of the red subpixel unit onto the base substrate. The first green light-shielding layer is connected to the green color filter unit, and an orthogonal projection of the first green light-shielding layer onto the base substrate completely covers an orthogonal projection of a semiconductor region of the switching TFT of the green subpixel unit onto the base substrate. The second light-shielding layer is a red light-shielding layer or a second green light-shielding layer. An orthogonal projection of the second green light-shielding layer onto the base substrate completely covers orthogonal projections of semiconductor regions of the switching TFTs of the blue subpixel unit and the white subpixel unit onto the base substrate, and the second green light-shielding layer is spaced apart from, i.e., not connected to, the blue color filter unit and the white color filter unit.

In a possible embodiment of the present disclosure, the second green light-shielding layer is spaced apart from the first green light-shielding layer.

In a possible embodiment of the present disclosure, the second green light-shielding layer is connected to the first green light-shielding layer.

In a possible embodiment of the present disclosure, the OLED is a bottom-emission OLED.

In a possible embodiment of the present disclosure, the white color filter unit corresponding to each white subpixel unit is a transparent film, or no color filter film is provided for the white subpixel unit.

In a possible embodiment of the present disclosure, each switching TFT is an oxide TFT.

In another aspect, the present disclosure provides in some embodiments an OLED display device including the above-mentioned OLED display substrate.

In yet another aspect, the present disclosure provides in some embodiments a method for manufacturing the above-mentioned OLED display substrate, including: providing a base substrate; and forming a plurality of pixel units and a light-shielding layer on the base substrate. Each pixel unit includes a plurality of subpixel units in various colors, and each subpixel unit includes a switching TFT and an OLED. The light-shielding layer is arranged between the OLED and the switching TFT, and an orthogonal projection of the light-shielding layer onto the base substrate completely covers an orthogonal projection of a semiconductor region of the switching TFT onto the base substrate.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION OF THE EMBODIMENTS

Figure 1:
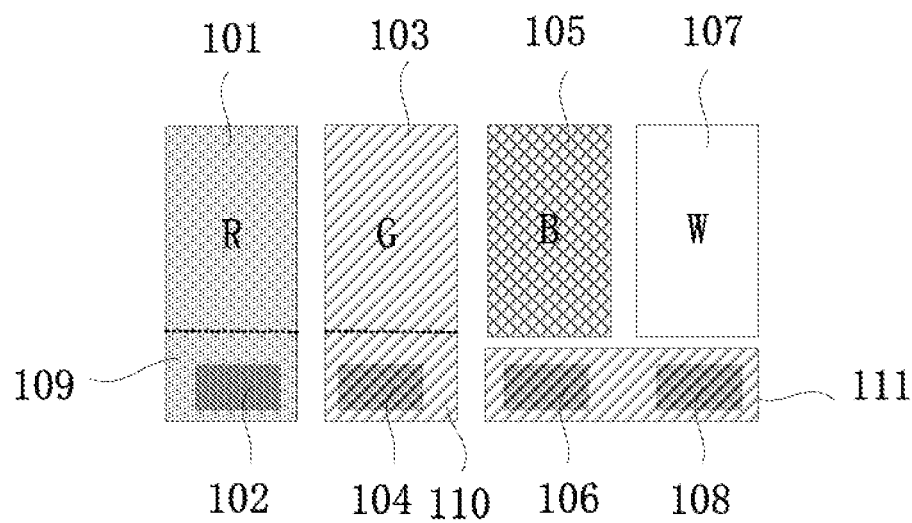
FIG. 1 is a schematic view showing a white OLED display substrate according to one embodiment of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

The present disclosure provides in some embodiments an OLED display substrate, which includes a base substrate and a plurality of pixel units arranged on the base substrate. Each pixel unit includes a plurality of subpixel units, and each subpixel unit includes a switching TFT and a bottom-emission OLED. The OLED display substrate further includes a light-shielding layer arranged between the OLED and the switching TFT, and an orthogonal projection of the light-shielding layer onto the base substrate completely covers an orthogonal projection of a semiconductor region of the switching TFT onto the base substrate.

According to the embodiments of the present disclosure, the light-shielding layer is arranged between the bottom-emission OLED and the switching TFT, so as to at least shield the semiconductor region (i.e., a channel region) of the switching TFT and prevent a light beam from the OLED from arriving at the semiconductor region. As a result, it is able to prevent the occurrence of the negative drift when the semiconductor region of the switching TFT is irradiated by the light beam from the OLED, thereby to improve a display effect.

Because the light beam is capable of refracted and scattered, it is difficult to prevent the semiconductor region of the switching TFT from being irradiated when merely the semiconductor region is covered by the light-shielding layer. In a possible embodiment of the present disclosure, the orthogonal projection of the light-shielding layer onto the base substrate may completely cover an orthogonal projection of the switching TFT onto the base substrate, i.e., the entire switching TFT may be completely shielded by the light-shielding layer, so as to further prevent the switching TFT from being irradiated by the light beam from the OLED.

In the embodiments of the present disclosure, a size of the shielding layer may be set in accordance with a specific structure of the OLED display substrate and a thickness of the light-shielding layer.

In the embodiments of the present disclosure, each switching TFT may be an oxide TFT. Due to the light-shielding layer between the bottom-emission OLED and the switching TFT, at least the semiconductor region (i.e., the channel region) of the switching TFT may be shielded by the light-shielding layer, so as to prevent the semiconductor region from being irradiated by any light beam in a low band, e.g., a blue light beam, from the OLED. In this way, it is able to prevent the switching TFT from being turned on abnormally when the semiconductor region of the switching TFT is irradiated by the light beam in a low band, thereby to improve the display effect. Of course, the switching TFT in the embodiments of the present disclosure may also be a TFT of any other type.

In some embodiments of the present disclosure, the OLED display substrate may be a white OLED display substrate, i.e., the OLED in each subpixel unit may be a white OLED. At this time, each subpixel unit may further include a color filter unit corresponding to a color of the subpixel unit. The white OLED is capable of emitting a white light beam which contains the light beam in a low band (e.g., the blue light beam), so light-shielding layer may be arranged between the white OLED and the switching TFT, so as to at least shield the semiconductor region (i.e., the channel region) of the switching TFT and prevent the semiconductor region from being irradiated by the light beam in a low band (e.g., the blue light beam) from the white OLED. In this way, it is able to prevent the switching TFT from being turned on abnormally when the semiconductor region of the switching TFT is irradiated by the light beam in a low band, thereby to improve the display effect.

In the embodiments of the present disclosure, the light-shielding layer may be made of various light-shielding materials, which will not be particularly defined herein.

In a possible embodiment of the present disclosure, a first color filter unit in a first color and a second color filter unit in a second color may be arranged at a region where each pixel unit is located, the first color filter unit is configured to filter out a blue light beam, and the second color filter unit is configured to allow the blue light beam to pass therethrough. The light-shielding layer may be created from a same layer as the first color filter unit, so as to reduce the number of masks during the manufacture, thereby to reduce the production cost.

In some embodiments of the present disclosure, the first color filter unit may include a red color filter unit, a green color filter unit or both.

In some embodiments of the present disclosure, the second color filter unit may include a blue color filter unit. For example, each pixel unit of the white OLED may be of a red (R)-green (G)-blue (B) structure, i.e., it may include a red color filter unit, a green color filter unit and a blue color filter unit. The second color filter unit may also include both a blue color filter unit and a white color filter unit. For example, each pixel unit of the white OLED may be of a R-G-B-white (W) structure, i.e., it may include a red color filter unit, a green color filter unit, a blue color filter unit and a white color filter unit.

In some embodiments of the present disclosure, in each pixel unit, the switching TFT of each subpixel unit may be arranged at a same side of a region where the color filter unit is located and arranged adjacent to the corresponding color filter unit. The light-shielding layer may include a first light-shielding layer and a second light-shielding layer. The first light-shielding layer may be connected to the first color filter unit, and an orthogonal projection of the first light-shielding layer onto the base substrate may completely cover an orthogonal projection of a semiconductor region of the switching TFT of the subpixel unit in the first color onto the base substrate. The second light-shielding layer may be spaced apart from the second color filter unit by a predetermined distance, and an orthogonal projection of the second light-shielding layer onto the base substrate may completely cover an orthogonal projection of a semiconductor region of the switching TFT of the subpixel unit in the second color onto the base substrate.

Referring to FIG. 1, in the embodiments of the present disclosure, each pixel unit includes a red subpixel unit R, a green subpixel unit G, a blue subpixel unit B and a white subpixel unit W. A red color filter unit 101 corresponding to the red subpixel unit, a switching TFT 102 corresponding to the red subpixel unit, a green color filter unit 103 corresponding to the green subpixel unit, a switching TFT 104 corresponding to the green subpixel unit, a blue color filter unit 105 corresponding to the blue subpixel unit, a switching TFT 106 corresponding to the blue subpixel unit, a white color filter unit 107 corresponding to the white subpixel unit, a switching TFT 108 corresponding to the white subpixel unit, and the light-shielding layer 109, 110, 111 may be arranged at a region where each pixel unit is located. The red color filter unit 101, the green color filter unit 103, the blue color filter unit 105 and the white color filter unit 107 may be arranged in one row and four columns. The light-shielding layer may include a red light-shielding layer 109, a first green light-shielding layer 110 and a second green light-shielding layer 111. The red light-shielding layer 109 may be connected to the red color filter unit 101, and an orthogonal projection of the red light-shielding layer 109 onto the base substrate may completely cover an orthogonal projection of a semiconductor region of the switching TFT 102 of the red subpixel unit onto the base substrate. The first green light-shielding layer 110 may be connected to the green color filter unit 103, and an orthogonal projection of the first green light-shielding layer 110 onto the base substrate may completely cover an orthogonal projection of a semiconductor region of the switching TFT 104 of the green subpixel unit onto the base substrate. An orthogonal projection of the second green light-shielding layer 111 onto the base substrate may completely cover orthogonal projections of semiconductor regions of the switching TFTs 106, 108 of the blue subpixel unit and the white subpixel unit onto the base substrate, and the second green light-shielding layer 111 may be spaced apart from, i.e., not connected to, the blue color filter unit and the white color filter unit.

In a possible embodiment of the present disclosure, the second light-shielding layer may be the second green light-shielding layer 111, and in some other embodiments of the present disclosure, the second light-shielding layer may also be the red light-shielding layer.

In a possible embodiment of the present disclosure, the second green light-shielding layer 111 may not be connected to the first green light-shielding layer 110, and in some other embodiments of the present disclosure, the second green light-shielding layer 111 may also be connected to the first green light-shielding layer 110.

In the embodiments of the present disclosure, the second green light-shielding layer 111 may be arranged adjacent to the blue color filter unit and the white color filter unit, and due to the limit of the manufacture process, the second green light-shielding layer 111 must be spaced apart from the blue color filter unit and the white color filter unit, so an aperture ratio of a subpixel corresponding to each of the blue color filter unit and the white color filter unit may be adversely affected.

In order to solve this problem, in a possible embodiment of the present disclosure, the switching TFT of each subpixel unit may be located at a same side of a region where the color filter unit is located and arranged adjacent to the first color filter unit, and the light-shielding layer may be connected to the first color filter unit. A region where the first color filter unit is located is arranged adjacent to a region where the switching TFT is located, so the light-shielding layer may be connected to the first color filter unit, so as to cover a region surrounding the switching TFT as much as possible, without any influence on the aperture ratio of the corresponding subpixel.

Figure 2:
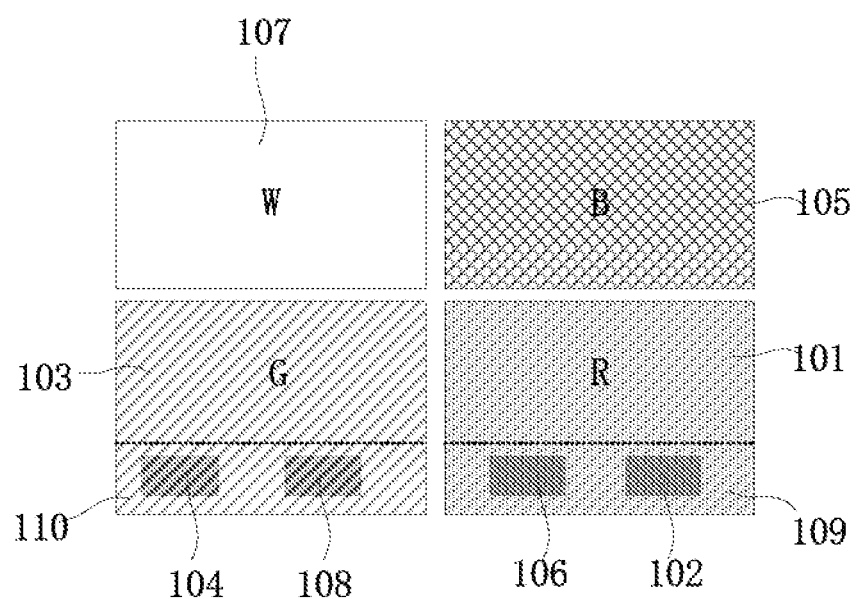
FIG. 2 is another schematic view showing the white OLED display substrate according to one embodiment of the present disclosure.

Referring to FIG. 2, in the embodiments of the present disclosure, each pixel unit includes the red subpixel unit R, the green subpixel unit G, the blue subpixel unit B and the white subpixel unit W. The red color filter unit 101 corresponding to the red subpixel unit, the switching TFT 102 corresponding to the red subpixel unit, the green color filter unit 103 corresponding to the green subpixel unit, the switching TFT 104 corresponding to the green subpixel unit, the blue color filter unit 105 corresponding to the blue subpixel unit, the switching TFT 106 corresponding to the blue subpixel unit, the white color filter unit 107 corresponding to the white subpixel unit, the switching TFT 108 corresponding to the white subpixel unit, and the light-shielding layer 109, 110 may be arranged at a region where each pixel unit is located. The red color filter unit 101, the green color filter unit 103, the blue color filter unit 105 and the white color filter unit 107 may be arranged in two rows and two columns, the red color filter unit 101 and the green color filter unit 103 may be arranged in a same row, and the blue color filter unit 105 and the white color filter unit 107 may be arranged in a same row. The light-shielding layer may include the red light-shielding layer 109 connected to the red color filter unit 101 and the green light-shielding layer 110 connected to the green color filter unit 103. Orthogonal projections of the red light-shielding layer 109 and the green light-shielding layer 110 onto the base substrate may completely cover orthogonal projections of the semiconductor regions of all the switching TFTs 102, 104, 106, 108 in each pixel unit onto the base substrate.

In the embodiments of the present disclosure, each switching TFT in a region where the corresponding pixel unit is located may be located at a same side of the color filter unit (i.e., at a lower side in FIG. 2), and arranged adjacent to the red color filter unit 101 and the green color filter unit 103, so sizes of the red color filter unit 101 and the green color filter unit 103 may be increased to form the red light-shielding layer 109 and the green light-shielding layer 110 respectively, so as to prevent the switching TFTs from being irradiated by the light beam in a low band (e.g., the blue light beam) from the white OLED. In this way, it is able to prevent the switching TFT from being turned on abnormally when the semiconductor region of the switching TFT is irradiated by the light beam in a low band (e.g., the blue light beam), thereby to improve the display effect. In addition, the red light-shielding layer 109 may be connected to the red color filter unit 101, and the green light-shielding layer 110 may be connected to the green color filter unit 103, so as to prevent the aperture ratio of the corresponding subpixel unit from being adversely affected due to the introduction of the light-shielding layer.

In FIG. 2, the orthogonal projection of the semiconductor region of the switching TFT 102 of the red subpixel unit onto the base substrate may be located within the orthogonal projection of the red light-shielding layer 109 onto the base substrate, the orthogonal projection of the semiconductor region of the switching TFT 104 of the green subpixel unit onto the base substrate may be located within the orthogonal projection of the green light-shielding layer 119 onto the base substrate, the orthogonal projection of the semiconductor region of the switching TFT 106 of the blue subpixel unit onto the base substrate may be located within the orthogonal projection of the red light-shielding layer 109 onto the base substrate, and the orthogonal projection of the semiconductor region of the switching TFT 108 of the white subpixel unit onto the base substrate is located within the orthogonal projection of the green light-shielding layer 110 onto the base substrate. In this regard, each switching TFT may be located closest to the corresponding subpixel unit, so as to simplify the manufacture process and prevent the occurrence of signal delay as compared with a situation where the switching TFT is located far away from the corresponding subpixel unit.

Of course, in some other embodiments of the present disclosure, a position of the red subpixel unit may be replaced with a position of the green subpixel unit, and a position of the blue subpixel unit may be replaced with a position of the white subpixel unit.

In the embodiments of the present disclosure, the white color filter unit 107 of each white subpixel unit may be a transparent film, or no color filter film may be provided for each white subpixel unit.

Experimental result shows that, when the light-shielding layer is added for each switching TFT of the white OLED display substrate, a maximum negative drift of the switching TFT is 3.5V, not exceeding Vgl (5.5V) of the switching TFT. As a result, it is able to prevent the switching TFT from being turned on abnormally, thereby to improve the display effect.

The present disclosure further provides in some embodiments an OLED display device including the above-mentioned OLED display substrate.

The present disclosure further provides in some embodiments a method for manufacturing the above-mentioned OLED display substrate, including: Step 11 of providing a base substrate; and Step 12 of forming a plurality of pixel units and a light-shielding layer on the base substrate. Each pixel unit includes a plurality of subpixel units in various colors, and each subpixel unit includes a switching TFT and an OLED. The light-shielding layer is arranged between the OLED and the switching TFT, and an orthogonal projection of the light-shielding layer onto the base substrate completely covers an orthogonal projection of a semiconductor region of the switching TFT onto the base substrate.

The manufacture procedure of the white OLED display substrate will be described hereinafter.

The method for manufacturing the white OLED display substrate may include the following steps.

Step 21: providing a base substrate, and cleansing the base substrate.

Step 22: forming a pattern of a gate metal layer on the base substrate. In the embodiments of the present disclosure, the gate metal layer may be deposited through sputtering or evaporation, and then patterned so as to acquire the pattern of the gate metal layer. The gate metal layer may have a thickness of about 220 nm, and it may be made of a metal material such as aluminium (Al) or copper (Cu).

Step 23: forming a gate insulation layer through Chemical Vapor Deposition (CVD).

Step 24: forming a pattern of an active layer. In the embodiments of the present disclosure, an indium gallium zinc oxide (IGZO) layer having a thickness of 10 to 80 nm may be deposited through sputtering, and then patterned so as to acquire the pattern of the active layer.

Step 25: forming a pattern of an etch stop layer. In the embodiments of the present disclosure, a silicon oxide (SiOx) or aluminium oxide (AlOx) layer having a thickness of 40 to 120 nm may be deposited through plasma enhanced chemical vapor deposition (PECVD) as the etch stop layer, and then patterned so as to acquire the pattern of the etch stop layer.

Step 26: forming a pattern of a source-drain metal layer. In the embodiments of the present disclosure, the source-drain metal layer may be formed through sputtering, and then patterned so as to acquire the pattern of the source-drain metal layer. The source-drain metal layer may have a thickness of about 220 nm, and it may be made of molybdenum (Mo), molybdenum tungsten (MoW), Cu or aluminium neodymium (AlNd).

Step 27: forming a pattern of a passivation layer. In the embodiments of the present disclosure, a SiOx or silicon nitride (SiNx) layer having a thickness of 200 to 400 nm may be deposited through PECVD as the passivation layer, and then patterned so as to acquire the pattern of the passivation layer.

Step 28: forming R, G, B and W color filter units, and forming the light-shielding layer at the same time.

Step 29: forming a pattern of a pixel electrode (i.e., an anode of the white OLED). In the embodiments of the present disclosure, an indium tin oxide (ITO) layer having a thickness of 40 nm to 135 nm or an indium zinc oxide (IZO) having a thickness of 40 to 135 nm may be deposited through sputtering, and then patterned so as to form the pattern of the pixel electrode.

Step 210: forming an organic light-emitting layer and a cathode of the white OLED.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An organic light-emitting diode (OLED) display substrate, comprising:
a base substrate; and
a plurality of pixel units arranged on the base substrate, wherein each pixel unit comprises a plurality of subpixel units, and each subpixel unit comprises a switching thin film transistor (TFT),
wherein the OLED display substrate further comprises a light-shielding layer arranged between an OLED and the switching TFT, and an orthogonal projection of the light-shielding layer onto the base substrate completely covers an orthogonal projection of a semiconductor region of the switching TFT onto the base substrate,
wherein each pixel unit comprises a red subpixel unit, a green subpixel unit, a blue subpixel unit and a white subpixel unit, the red subpixel unit comprises a red color filter and a first switching TFT, the green subpixel unit comprises a green color filter and a second switching TFT, the blue subpixel unit comprises a blue color filter and a third switching TFT, the white subpixel unit comprises a white color filter and a fourth switching TFT;
wherein the light-shielding layer completely covers an orthogonal projection of a semiconductor region of the first switching TFT in the red subpixel unit onto the base substrate, an orthogonal projection of a semiconductor region of the second switching TFT in the green subpixel unit onto the base substrate, an orthogonal projection of a semiconductor region of the third switching TFT in the blue subpixel unit onto the base substrate, an orthogonal projection of a semiconductor region of the fourth switching TFT in the white subpixel unit onto the base substrate.

2. The OLED display substrate according to claim 1, wherein a color filter in a first color and a color filter in a second color are arranged at a region where each pixel unit is located, the color filter in the first color is configured to filter out a blue light beam, and the color filter in the second color is configured to allow the blue light beam to pass therethrough.

3. The OLED display substrate according to claim 2, wherein the light-shielding layer is created from a same layer as the color filter in the first color.

4. The OLED display substrate according to claim 2, wherein the first color is red or green, and the second color is blue or white.

5. The OLED display substrate according to claim 2, wherein in each pixel unit, the switching TFT of each subpixel unit is arranged adjacent to the color filter in the first color, and the light-shielding layer is connected to the color filter in the first color.

6. The OLED display substrate according to claim 2, wherein in each pixel unit, the switching TFT of each subpixel unit is located at a same side of a region where the color filter is located and arranged adjacent to the corresponding color filter;
the light-shielding layer comprises a first light-shielding layer and a second light-shielding layer;
the first light-shielding layer is connected to the color filter in the first color, and an orthogonal projection of the first light-shielding layer onto the base substrate completely covers the orthogonal projection of the semiconductor region of the switching TFT of the subpixel unit in the first color onto the base substrate; and the second light-shielding layer is spaced apart from the color filter in the second color, and an orthogonal projection of the second light-shielding layer onto the base substrate completely covers the orthogonal projection of the semiconductor region of the switching TFT of the subpixel unit in the second color onto the base substrate.

7. The OLED display substrate according to claim 6, wherein each pixel unit comprises a red subpixel unit, a green subpixel unit, a blue subpixel unit and a white subpixel unit;
the light shielding layer, a red color filter corresponding to the red subpixel unit, a switching TFT corresponding to the red subpixel unit, a green color filter corresponding to the green subpixel unit, a switching TFT corresponding to the green subpixel unit, a blue color filter corresponding to the blue subpixel unit, a switching TFT corresponding to the blue subpixel unit, a white color filter corresponding to the white subpixel unit and a switching TFT corresponding to the white subpixel unit are arranged at a region where each pixel unit is located;
the red color filter, the green color filter, the blue color filter and the white color filter are arranged in one row and four columns;
the first light-shielding layer comprises a red light-shielding layer and a first green light-shielding layer;
the red light-shielding layer is connected to the red color filter, and an orthogonal projection of the red light-shielding layer onto the base substrate completely covers an orthogonal projection of a semiconductor region of the switching TFT of the red subpixel unit onto the base substrate;
the first green light-shielding layer is connected to the green color filter, and an orthogonal projection of the first green light-shielding layer onto the base substrate completely covers an orthogonal projection of a semiconductor region of the switching TFT of the green subpixel unit onto the base substrate;
the second light-shielding layer is a red light-shielding layer or a second green light-shielding layer; and
an orthogonal projection of the second green light-shielding layer onto the base substrate completely covers orthogonal projections of semiconductor regions of the switching TFTs of the blue subpixel unit and the white subpixel unit onto the base substrate, and the second green light-shielding layer is spaced apart from the blue color filter and the white color filter.

8. The OLED display substrate according to claim 7, wherein the second green light-shielding layer is spaced apart from the first green light-shielding layer.

9. The OLED display substrate according to claim 7, wherein the second green light-shielding layer is connected to the first green light-shielding layer.

10. The OLED display substrate according to claim 1, wherein the OLED is a bottom-emission OLED.

11. A method for manufacturing the OLED display substrate according to claim 1, comprising:
providing a base substrate; and
forming a plurality of pixel units and a light-shielding layer on the base substrate,
wherein each pixel unit comprises a plurality of subpixel units in various colors, and each subpixel unit comprises a switching TFT and an OLED, the light-shielding layer is arranged between the OLED and the switching TFT, and an orthogonal projection of the light-shielding layer onto the base substrate completely covers an orthogonal projection of a semiconductor region of the switching TFT onto the base substrate.

12. The OLED display substrate according to claim 1, wherein the light-shielding layer and the color filter corresponding to at least one of the plurality of subpixel units are a continuous layer.

13. The OLED display substrate according to claim 1, wherein;
the red color filter, the green color filter, the blue color filter and the white color filter are arranged in two rows and two columns, the red color filter and the green color filter are arranged in a same row, and the blue color filter and the white color filter are arranged in a same row;
the light-shielding layer comprises a red light-shielding layer connected to the red color filter and a green light-shielding layer connected to the green color filter; and
orthogonal projections of the red light-shielding layer and the green light-shielding layer onto the base substrate completely cover orthogonal projections of the semiconductor regions of all the switching TFTs in each pixel unit onto the base substrate.

14. The OLED display substrate according to claim 13, wherein the orthogonal projection of the semiconductor region of the switching TFT of the red subpixel unit onto the base substrate is located within the orthogonal projection of the red light-shielding layer onto the base substrate, the orthogonal projection of the semiconductor region of the switching TFT of the green subpixel unit onto the base substrate is located within the orthogonal projection of the green light-shielding layer onto the base substrate, the orthogonal projection of the semiconductor region of the switching TFT of one of the blue subpixel unit and the white subpixel unit onto the base substrate is located within the orthogonal projection of the red light-shielding layer onto the base substrate, and the orthogonal projection of the semiconductor region of the switching TFT of the other of the blue subpixel unit and the white subpixel unit onto the base substrate is located within the orthogonal projection of the green light-shielding layer onto the base substrate.

15. The OLED display substrate according to claim 13, wherein the white color filter corresponding to each white subpixel unit is a transparent film, or no color filter film is provided for the white subpixel unit.

16. The OLED display substrate according to claim 1, further comprising a driving thin film transistor, wherein
an orthogonal projection of the light-shielding layer onto the base substrate does not overlap with an orthogonal projection of the driving thin film transistor onto the base substrate.

17. The OLED display substrate according to claim 1, wherein each subpixel unit further comprises a color filter unit corresponding to a color of the subpixel unit, the light-shielding layer and the color filter unit corresponding to at least one of the plurality of subpixel units are in a same layer and have a same material;
wherein in each pixel unit, the switching TFT of each subpixel unit is arranged at a same side of a region where the color filter unit is located.

18. An organic light-emitting diode (OLED) display substrate, comprising:
a base substrate; and
a plurality of pixel units arranged on the base substrate, wherein each pixel unit comprises a plurality of subpixel units, and each subpixel unit comprises a switching thin film transistor (TFT), wherein the OLED display substrate further comprises a light-shielding layer arranged between an OLED and the switching TFT, and an orthogonal projection of the light-shielding layer onto the base substrate completely covers an orthogonal projection of a semiconductor region of the switching TFT onto the base substrate, wherein each pixel unit comprises a red subpixel unit, a green subpixel unit, a blue subpixel unit and a white subpixel unit, the red subpixel unit comprises a red color filter and a first switching TFT, the green subpixel unit comprises a green color filter and a second switching TFT, the blue subpixel unit comprises a blue color filter and a third switching TFT, the white subpixel unit comprises a white color filter and a fourth switching TFT;

wherein the light-shielding layer completely covers an orthogonal projection of the first switching TFT in the red subpixel unit onto the base substrate, an orthogonal projection of the second switching TFT in the green subpixel unit onto the base substrate, an orthogonal projection of the third switching TFT in the blue subpixel unit onto the base substrate, an orthogonal projection of a semiconductor region of the fourth switching TFT in the white subpixel unit onto the base substrate.

19. The OLED display substrate according to claim 18, wherein each subpixel unit further comprises a color filter unit corresponding to a color of the subpixel unit, the light-shielding layer and the color filter unit corresponding to at least one of the plurality of subpixel units are in a same layer and have a same material;

wherein in each pixel unit, the switching TFT of each subpixel unit is arranged at a same side of a region where the color filter unit is located.

20. The OLED display substrate according to claim 18, further comprising a driving thin film transistor, wherein
an orthogonal projection of the light-shielding layer onto the base substrate does not overlap with an orthogonal projection of the driving thin film transistor onto the base substrate.

\* \* \* \* \*